United States Patent [19]

Yeu

[11] Patent Number: 5,268,600
[45] Date of Patent: Dec. 7, 1993

[54] BOOSTING CLAMPING CIRCUIT AND OUTPUT BUFFER CIRCUIT USING THE SAME

[75] Inventor: Jei-hwan Yeu, Suwon, Rep. of Korea

[73] Assignee: Samsung Electronics Co., Ltd., Kyunggi, Rep. of Korea

[21] Appl. No.: 876,527

[22] Filed: Apr. 30, 1992

[30] Foreign Application Priority Data

Feb. 14, 1992 [KR] Rep. of Korea .................. 92-2219

[51] Int. Cl.$^5$ .............................................. H03K 4/58
[52] U.S. Cl. ................... 307/482; 307/443; 307/556; 307/578
[58] Field of Search ............ 307/443, 452, 482, 543, 307/555-557, 552, 578

[56] References Cited

U.S. PATENT DOCUMENTS

| 4,508,978 | 4/1985 | Reddy ............................... 307/482 |
| 4,527,077 | 7/1985 | Higuchi et al. .................. 307/555 X |
| 4,570,244 | 2/1986 | Sud et al. ........................ 307/482 X |
| 5,027,013 | 6/1991 | Coy et al. ........................ 307/482 X |

Primary Examiner—David R. Hudspeth
Attorney, Agent, or Firm—Rothwell, Figg, Ernst & Kurz

[57] ABSTRACT

A boosting-clamping circuit for initially outputting a boosted voltage level, and lowering and clamping the output voltage level to a predetermined level as time elapses, and an output buffer circuit using the same, includes a boosting circuit for receiving a signal to boost and outputting the signal into a high input impedance device and a clamping circuit having one node connected to the output terminal of the boosting circuit and the other node connected to ground, for lowering and clamping the output voltage level of the boosting circuit to a predetermined level as time elapses. The output buffer circuit using the boosting-clamping circuit has a fast response time and a proper output voltage level when outputting a data bit "1," thereby reducing the ground noise during outputting data "0" and improving the response speed of data "0".

14 Claims, 4 Drawing Sheets

BOOSTING CLAMPING CIRCUIT AND OUTPUT BUFFER CIRCUIT USING THE SAME

BACKGROUND OF THE INVENTION

The present invention relates to a boosting-clamping circuit initially providing a boosted voltage level according to a given input data signal and providing a voltage level lowered and fixed to a predetermined level as time elapses, and to an output buffer circuit having such a boosting-clamping circuit.

The boosting circuit stores charge in a pumping capacitor when the signal supplied to its input terminal is a binary "0" state, and outputs the boosted potential by summing the potential supplied to the input terminal and the potential due to the charge stored in the pumping capacitor, when the signal supplied to the input terminal goes from a binary "0" to a binary "1" state. The boosting circuit is connected to the input terminal of a semiconductor transistor which is turned on or off according to the signal supplied to the input terminal, thereby improving the switching characteristic. However, since the boosting circuit continuously maintains the boosted potential when the signal supplied to its input terminal is a binary "1", the output level of the semiconductor device having the above boosting circuit becomes excessively higher than the reference output level.

Particularly, an output buffer circuit having a pull-up transistor, a pull-down transistor, and the boosting circuit connected to the input terminal of the pull-up transistor, has a fast switching characteristic during the outputting of data "1," but has a slow switching characteristic and high ground noise when outputting data "0" because the output level of data "1" is too high to be rapidly discharged to the low output level of data "0".

SUMMARY OF THE INVENTION

An object of the present invention is to provide a booster-clamping circuit which outputs a boosted signal at first and, as time goes by, clamps the output signal to a pre-determined lower level, when a signal input into an input terminal is a binary "1."

Another object of the present invention is to provide an output buffer circuit which shortens the loss of response speed when outputting a data bit "1," and has fast response-speed characteristics and reduces ground noise when outputting data "0."

To achieve the above object, a boosting-clamping circuit according to the present invention comprises:

a boosting circuit for receiving and boosting a signal and then outputting the boosted signal into a device having high input impedance; and a clamping circuit having one node coupled to the output terminal of the boosting circuit and the other node coupled to ground, and which clamps the output level of the boosting circuit to a pre-determined level as time elapses.

To attain the other object, an output buffer circuit comprises:

a pair of pull-up and pull-down transistors serially connected between a supply voltage and ground;

an output terminal placed between the pull-up transistor and the pull-down transistor, for outputting data;

a boosting circuit coupled to the input terminal of the pull-up transistor for driving the pull-up transistor into a boosted output voltage level when outputting data "1"; and a clamping circuit having one end coupled to a connecting node of the boosting circuit and pull-up transistor and the other end coupled to ground, for clamping the boosted voltage level to a pre-determined level as time elapses, when outputting data "1."

BRIEF DESCRIPTION OF THE DRAWINGS

The above object and other advantages of the present invention will become more apparent by describing in detail a preferred embodiment of the present invention with reference to the attached drawings in which.

DETAILED DESCRIPTION OF THE INVENTION

Before explaining the structure and operation of a boosting-clamping circuit and output buffer circuit using the same according to the present invention in reference with the accompanying drawings, a conventional output buffer circuit will be explained in detail referring to FIG. 1 and FIG. 2.

Figure 1:
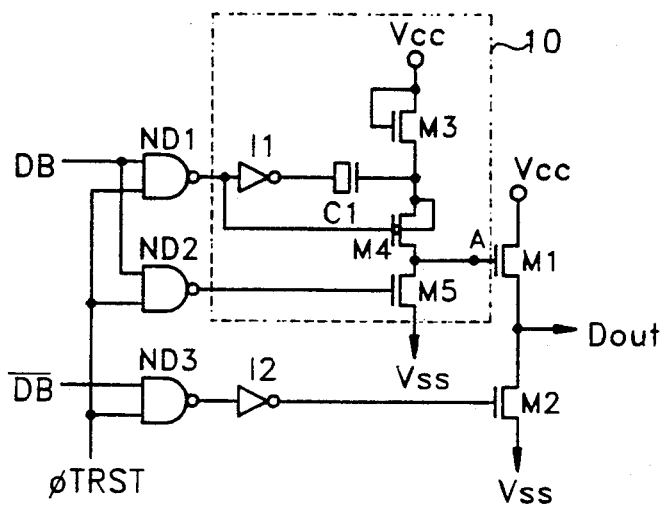
FIG. 1 is a circuit diagram of a conventional output buffer.

Referring to FIG. 1, a conventional output buffer circuit includes a first NAND gate ND1 and a second NAND gate ND2 both of which receive a non-inverted data signal DB and a control signal $\phi$TRST, and perform a NAND operation on the signals, a third NAND gate ND3 which receives an inverted data signal DB and control signal $\phi$TRST and performs a NAND operation on these the signals, a pull-up transistor M1 switched according to the voltage supplied to the gate terminal thereof, a boosting circuit 10 coupled to the output terminals of first and second NAND gates ND1 and ND2 and generating a higher voltage than the level of the logic "HIGH" voltage when outputting data "1" to supply the voltage to pull-up transistor M1, a second inverter I2 connected to the output terminal of third NAND gate ND3 for inverting its output signal, and a pull-down transistor M2 switched according to the output signal of second inverter I2. In FIG. 1, the boosting circuit 10 comprises a second pull-up transistor M4 becoming "on" during the outputting of data "1" as the data signal DB; a second pull-down transistor M5 becoming "on" during the outputting of data "0" as the data signal DB; a pumping capacitor C1 storing the charge supplied from a supply voltage source Vcc via diode-connected transistor M3 during the outputting of a data "0", adding an input voltage level to a pumping voltage level by the stored charge during the outputting of data "1," thereby to supply the boosted voltage level; and a first inverter I1.

The operation of the output buffer circuit shown in FIG. 1 having the above structure is as follows.

In FIG. 1, when data signal DB is a binary "1," inverted data signal $\overline{DB}$ is a binary "0," and control signal $\phi$TRST is a binary "1," the output signals of first and second gates ND1 and ND2 are both a binary "0," and the output signal of third NAND gate ND3 is a binary "1." Therefore, second pull-up transistor M4, namely, a PMOS transistor of the boosting circuit 10, becomes "on" and second pull-down transistor M5 becomes "off," so that the "gate" of pumping capacitor C1 supplies a voltage to the gate of first pull-up transistor M1 via second pull-up transistor M4. At this time, when receiving a binary "0" signal via second invertor I2, first pull-down transistor M2 becomes "off." Accordingly, the voltage level of node A in the circuit of FIG. 1 is the result of adding the potential of the charge of pumping capacitor C1 and the potential passing first invertor I1, so that first pull-up transistor M1 becomes "on," and the signal of an output terminal Dout of the output buffer circuit becomes a binary "1."

Meanwhile, when data signal DB is a binary "0" and inverted data signal $\overline{DB}$ and output control signal $\phi$TRST are both a binary "1," the output signals of first and second NAND gates ND1 and ND2 both become a binary "1" and the output of third NAND gate ND3 becomes a binary "0." Accordingly, boosting circuit 10 is "off" and the output signal of third NAND gate ND3 is inverted by second inverter I2, so that first pull-down transistor M2 is "on" and the output node signal of the circuit in FIG. 1 is a binary "0."

At this time, the boosting circuit of the output buffer circuit plays the role of improving the speed response characteristics when outputting data "1." Since node A continuously maintains a high voltage level, output terminal Dout of the output buffer circuit in FIG. 1 maintains an output voltage of an excessively high potential, so that the response speed when outputting data "0" is undesirably slow and the ground noise is increased.

Figure 2:
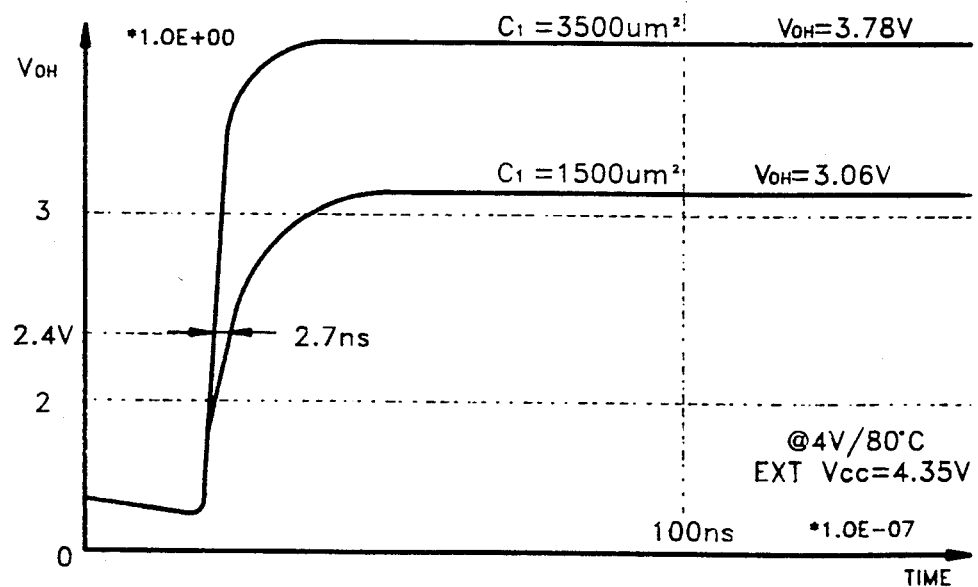
FIG. 2 is an output waveform plot of the circuit shown in FIG. 1.

FIG. 2 represents output waveforms when outputting data "1" in a conventional output buffer circuit shown in FIG. 1, wherein the boosting level of the boosting circuit (namely, the size of pumping capacitor C1 of the boosting circuit) determines the steady-state output voltage level and the switching time of the output buffer circuit in FIG. 1. Therefore, in order to lower output voltage $V_{OH}$ when outputting data "1," the capacity of pumping capacitor C1 should be reduced. However, in this case, as shown in FIG. 2, when output voltage $V_{OH}$ is lowered from 3.78 V to 3.06 V, the output speed of a data "1" is slowed down by 2.7 ns. The structure and operation of a conventional output buffer circuit has been explained above, and the structure and operation of a shooting-clamping circuit and output buffer circuit using the same according to the present invention will now be explained.

Figure 3:
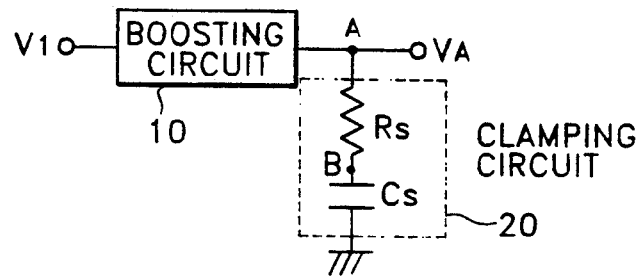
FIG. 3 is a block diagram of a boosting-clamping circuit of the present invention.

FIG. 3 represents a block diagram of a boosting-clamping circuit according to the present invention, and comprises a boosting circuit 10 receiving an input voltage V1, and a clamping circuit 20 connected between the output terminal of the boosting circuit and ground, wherein clamping circuit 20 comprises a resistor Rs and a first capacitor Cs of a predetermined size. Here, resistor Rs can be formed of polysilicon or the n+ or p+ region of a MOS structure in a semiconductor device, and first capacitor Cs can be formed of MOS structure. That is, one end of first capacitor Cs is formed by connecting the source of a MOS transistor with its drain which are then connected to ground, and the other end is constituted by the gate of the MOS transistor and is connected to resistor Rs. This first capacitor Cs formed of a MOS structure is preferably an NMOS type capacitor wherein its capacitance is small in some initial period during boosting, but as the voltage supplied to the "gate" of the first capacitor increases over time, its capacitance is then increased.

Figure 4:
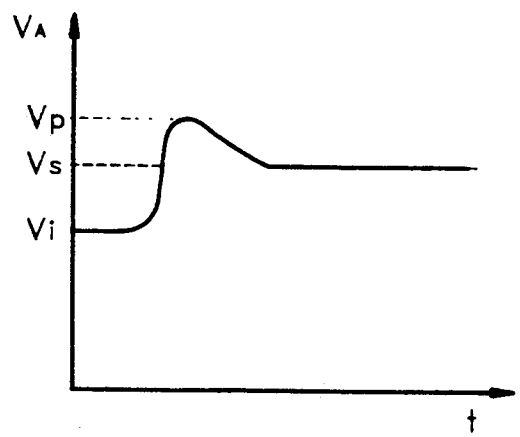
FIG. 4 is an output waveform plot of the circuit shown in FIG. 3.

FIG. 4 is a waveform plot of the voltage at a node A in FIG. 3, wherein node A is precharged to the voltage Vi before the boosting operation. Here, if a binary "1" signal is inputted to input terminal V1 of the boosting circuit (V1 increases from 0V to Vcc), the voltage at node A is increased by Vp at first because the effect of the first capacitor Cs can be ignored due to the resistor Rs. As time passes, the charge of node A moves to node B via resistor Rs, because the voltage at node B is lower than node A. Therefore, the voltage at node A is slowly lowered to that of node B, and maintains the saturation voltage level Vs without being further reduced.

Figure 5:
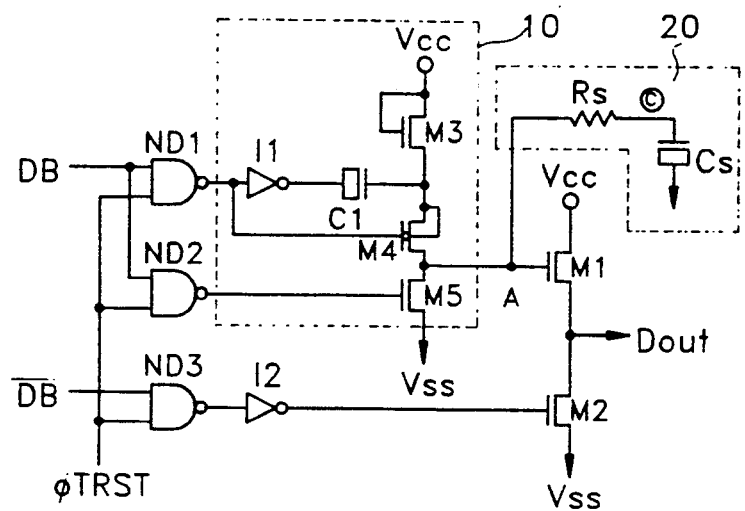
FIG. 5 is a circuit diagram of the output buffer including the boosting-clamping circuit of the present invention.

FIG. 5 is an embodiment of an output buffer circuit comprising a boosting-clamping circuit, wherein the output buffer circuit is the same as the output buffer circuit in FIG. 1 except for further comprising a clamping circuit 20 connected between the gate of pull-up transistor M1 and ground. The operation of the output buffer circuit is hereinafter explained.

Referring to FIG. 5, as described above, in the output buffer circuit according to the present invention, when outputting data "1," the three NAND gates ND1, ND2, and ND3 are binary "0," "0" and "1" states, respectively. Therefore, a PMOS-type second pull-up transistor M4 becomes "on" and an NMOS-type second pull-down transistor M5 becomes "off," so that the voltage level at node A initially is a boosted voltage level which is the sum of the potential of the charge stored in pumping capacitor C1 and the potential of a binary "1." Then, as the time elapses, the voltage at node A is lowered and fixed to a predetermined level. First pull-up transistor M1 becomes "on" by the potential of node A, and first pull-down transistor M2 receiving a binary "0" signal inverted due to the second inverter I2, becomes "off", so that output terminal Dout outputs data "1."

Here, if the saturation voltage level at node A is denoted by Vs, the parasitic capacitance at the output terminal of the pumping capacitor is denoted by CP1, and the parasitic capacitance at node A is denoted by CP2, the saturation voltage level Vs is represented by the following equation.

$$Vs = \frac{(CP1 + CP2)VB}{CP1 + CP2 + Cs}$$

where VB is the voltage at node A in case of having no clamping circuit.

Accordingly, when CP1 and CP2 are fixed, saturation voltage Vs can control the capacitance of first capacitor Cs of the clamping circuit. Namely, the value of resistor Rs functions as a factor determining the boosted voltage level by determining the degree of the effect of first capacitor Cs during initial boosting, and first capacitor Cs functions as a factor determining the boosted voltage level during saturation. In order to carry out such a function effectively, first capacitor Cs is desirably an NMOS-type capacitor whose capacitance increases according to the increase of the voltage supplied to the gate of first capacitor Cs.

Meanwhile, in FIG. 5, when outputting data "0," the three NAND gates ND1, ND2 and ND3 are binary "1," "1" and "0" states, respectively, and first pull-down transistor M2 becomes "on" due to the signal inverted to a binary "1" by second invertor I2, so that output terminal Dout outputs a data bit "0."

Figure 6:
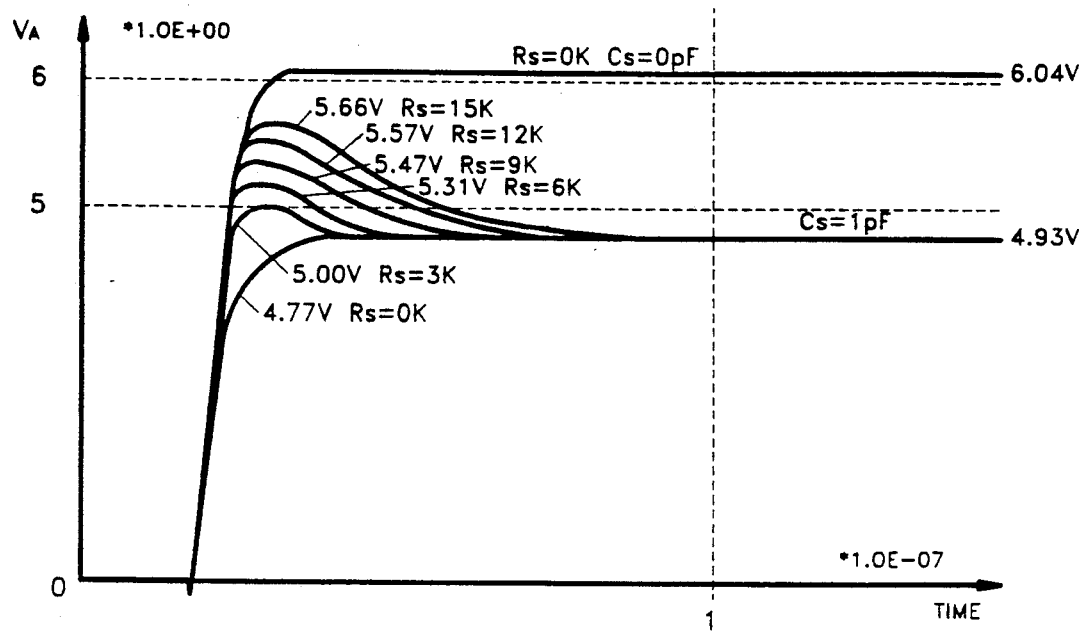
FIG. 6 is a set of voltage waveforms according to the variation of the resistance at the node A in the circuit of FIG. 5.

FIG. 6 is a set of voltage waveforms at node A according to the resistance of resistor Rs of clamping circuit 20 in FIG. 5. When the resistance of resistor Rs and the capacitance of first capacitor Cs are both zero, that is, without the clamping circuit, the voltage level at node A is 6.04 V. In the case of comprising the boosting-clamping circuit, if the capacitance of first capacitor Cs is fixed to 1 pF, the voltage level at saturation settles to 4.93 V, but the initial voltage level increases as the resistance of resistor Rs increases.

Figure 7:
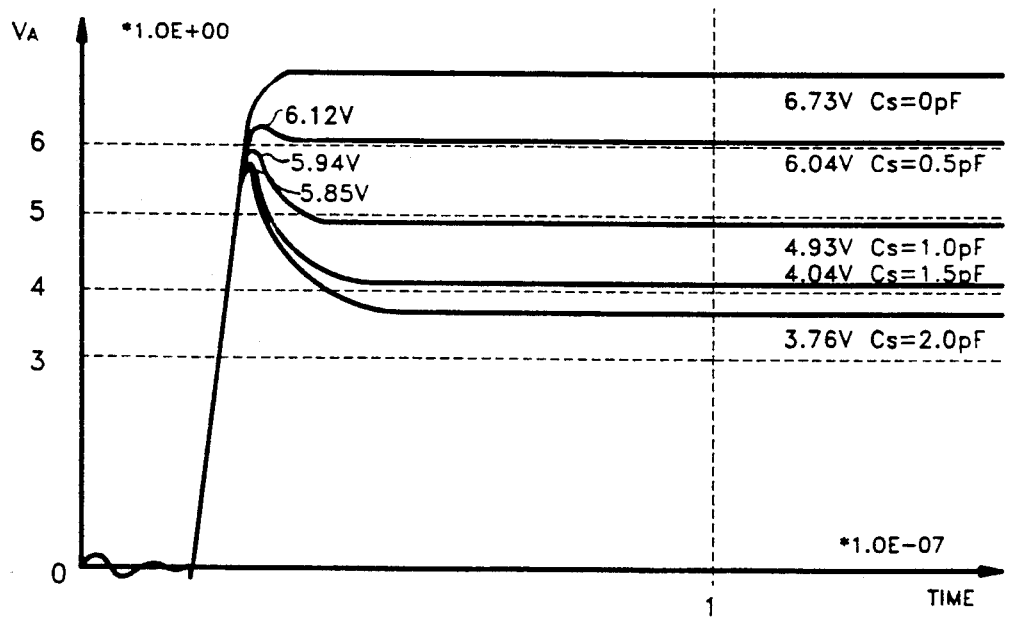
FIG. 7 is a set of voltage waveforms according to the variation of the capacitance at the node A in the circuit of FIG. 5.

FIG. 7 is a set of voltage waveforms at node A of the output buffer circuit in FIG. 5 according to the capacitance of first capacitor Cs. As the capacitance of first capacitor Cs increases, the voltage level at node A during saturation decreases.

Figure 8:
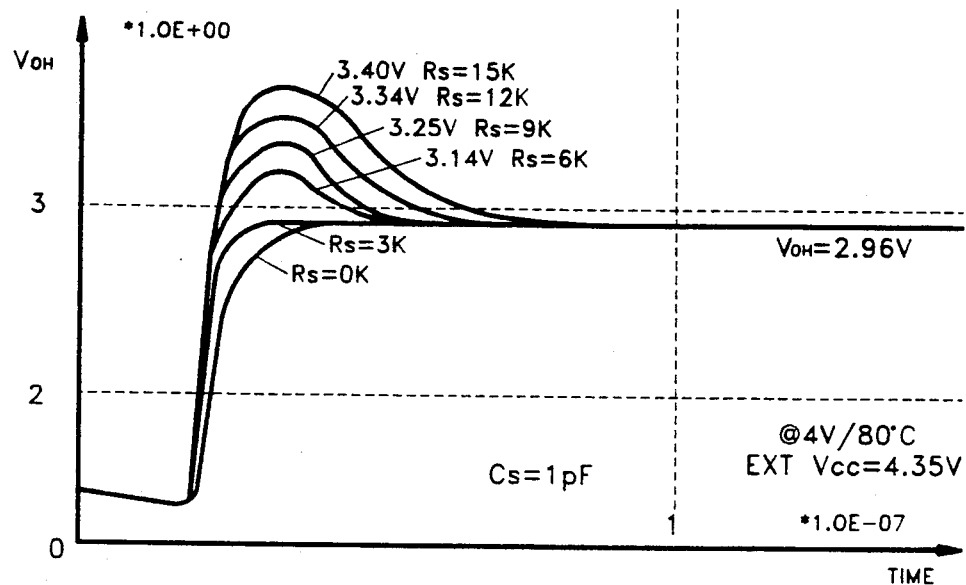
FIG. 8 is a set of output voltage waveforms according to the variation of the resistance in the circuit of FIG. 5.

FIG. 8 is a set of output waveforms of output buffer circuit in FIG. 5 according to the resistance of resistor Rs of the clamping circuit when outputting a data bit "1." The voltage level at saturation is fixed to 2.96 V, but the initial voltage level output to the output terminal of the output buffer during the boosting operation increases as the resistance of resistor Rs increases.

Figure 9:
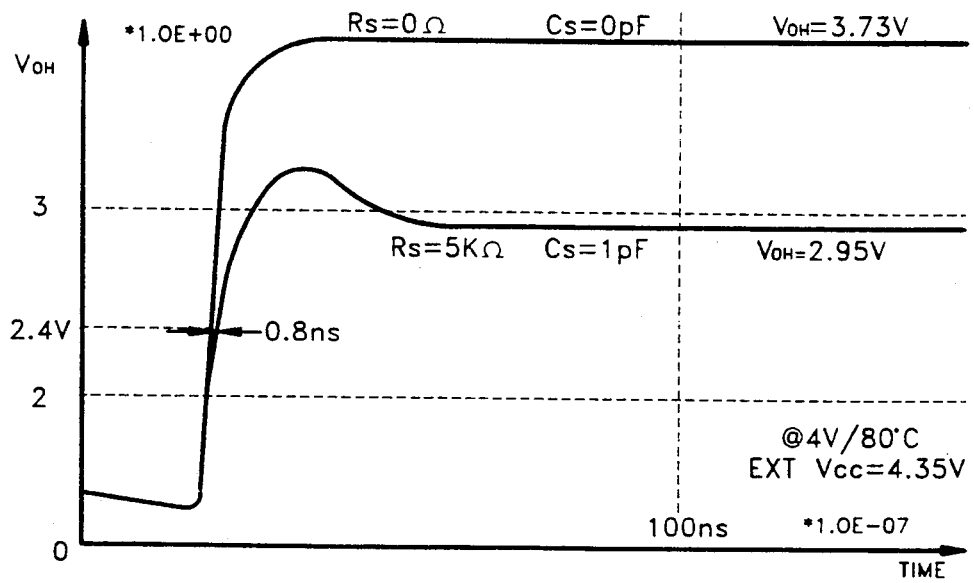
FIG. 9 is a set of output voltage waveforms in the circuit of FIG. 5.

FIG. 9 for explaining the effect of the present invention, is a set of the output waveforms present at output terminal Dout of the output buffer circuit during the outputting of data bit "1," when the size of pumping capacitor C1 in FIG. 5 is 3500 $\mu m^2$ as shown in FIG. 2, and shows the case where the resistance of resistor Rs is 5kΩ and the capacitance of first capacitor Cs is 1.0 pF in clamping circuit 20, and where they are both zero, namely, when the output buffer circuit doesn't include the clamping circuit.

As shown in FIG. 2, in the conventional output buffer circuit, the output voltage level is lowered from 3.78 V to 3.06 V by reducing the size of the pumping capacitor of the boosting circuit, and the response time is slowed by about 2.7 ns. However, in the output buffer circuit of the present invention, the output voltage level during saturation state is lowered from 3.78 V to 2.96 V by comprising the clamping circuit coupled to the output terminal of the boosting circuit, and the response time is slowed by 0.8 ns. That is, though the present invention further reduces the output voltage level during saturation over that of the conventional buffer circuit, the response characteristic is improved by reducing the output delay time of a logic "1" from 2.7 ns to 0.8 ns.

The shooting-clamping circuit of the present invention outputs the boosted voltage level during some initial period if the input signal is a binary "1," and outputs a voltage level lowered and fixed to a predetermined level after a certain time elapses. Also, the output buffer circuit comprising such a boosting-clamping circuit has a fast response characteristic when outputting data "1" and an output voltage level reduced to the proper level, thereby improving the response characteristic and reducing the ground noise when outputting data "0."

What is claimed is:

1. A boosting-clamping circuit comprising:
   a boosting circuit receiving a signal to be boosted, boosting the signal when the state of the signal is changed from a first state to a second state, and then outputting the boosted signal at a certain output voltage level to a device having high input impedance; and
   a clamping circuit having a serially-connected resistor-capacitor network coupled between an output terminal of said boosting circuit and ground, and which clamps the output voltage level of said boosted signal to a predetermined level during the second state interval of said signal.

2. A boosting-clamping circuit as claimed in claim 1, wherein said resistor is formed of polysilicon in a semiconductor device.

3. A boosting-clamping circuit as claimed in claim 1, wherein said resistor is formed of an impurity layer or n+ or p+ regions of a MOS structure in a semiconductor device.

4. A boosting-clamping circuit as claimed in claim 1, wherein said capacitor is formed of a MOS structure in a semiconductor device.

5. An output buffer circuit comprising:
   a pull-up transistor and a pull-down transistor connected in series between a supply voltage and ground;
   an output terminal placed between said pull-up and pull-down transistors for outputting a data signal;
   a boosting circuit having an output coupled to an input terminal of said pull-up transistor, for receiving a signal and boosting the received signal when the state thereof is changed from a first state to a second state, and outputting a boosted voltage level to the input terminal of said pull-up transistor when outputting data "1"; and
   a clamping circuit having a serially-connected resistor-capacitor network coupled between said input terminal of said pull-up transistor and ground, for clamping the output voltage level of said data signal to a predetermined level during the second state interval of said signal.

6. An output buffer circuit as claimed in claim 5, wherein said resistor is formed of polysilicon in a semiconductor device.

7. An output buffer circuit as claimed in claim 5, wherein said resistor is formed of an impurity layer in a semiconductor device.

8. An output buffer circuit as claimed in claim 5, wherein said capacitor is an NMOS-structure in a semiconductor device.

9. An output buffer circuit comprising:
   a pair of data lines respectively receiving non-inverted and inverted data signals;
   a first NAND gate and a second NAND gate each receiving a control signal as an output enable signal and said non-inverted data, and carrying out a NAND operation on said control signal and said non-inverted data;
   a third NAND gate receiving said control signal as an output enable signal and said inverted data, and carrying out a NAND operation on said control signal and said inverted data;
   a boosting circuit coupled to output terminals of said first NAND gate and second NAND gate, for outputting a voltage higher than a reference voltage of a binary "1" when outputting data of "1" and outputting a reference voltage of a binary "0" when outputting data of "0";

a clamping circuit having one node connected to an output terminal of said boosting circuit and another node connected to ground, for lowering and clamping the output signal of said boosting circuit to a predetermined level as time elapses when outputting a data "1";

a first pull-up transistor switched according to the output voltage of said boosting circuit;

a first inverter inverting the output signal of said third NAND gate;

a first pull-down transistor switched according to the output signal of said first inverter; and an output terminal coupled to a connecting node between said first pull-down transistor and said first pull-up transistor, which pull-up and pull-down transistors are serially coupled between a power supply and ground.

10. An output buffer circuit as claimed in claim 9, wherein said boosting circuit comprises:

a second inverter for inverting the output signal of said first NAND gate;

a diode having one end connected to said power supply;

a pair of a second pull-up transistor and a second pull-down transistor serially connected between said diode and ground; and a pumping capacitor connected between said diode and said second inverter for being charged through said diode during the outputting of a data bit "0" and outputting a pumping voltage level during the outputting of a data bit "1,"

said second pull-down transistor receiving the output signal of said second NAND gate and the boosted voltage level being output at the connecting node between said second pull-up transistor and said second pull-down transistor.

11. An output buffer circuit as claimed in claim 9, wherein said clamping circuit comprises a resistor and a capacitor serially coupled between said output terminal of said boosting circuit and ground.

12. An output buffer circuit as claimed in claim 11, wherein said resistor is formed of polysilicon in a semiconductor device.

13. An output buffer circuit as claimed in claim 11, wherein said resistor is formed of an impurity layer in a semiconductor device.

14. An output buffer circuit as claimed in claim 11, wherein said capacitor is formed of an NMOS structure in a semiconductor device.

* * * * *

UNITED STATES PATENT AND TRADEMARK OFFICE
CERTIFICATE OF CORRECTION

PATENT NO. : 5,268,600
DATED : December 7, 1993
INVENTOR(S) : Jei-hwan Yeu

It is certified that error appears in the above-identified patent and that said Letters Patent is hereby corrected as shown below:

Col. 1, line 42, "booster" should be --boosting--.

Col. 2, line 50, "DB" should be --$\overline{DB}$--.

Col. 2, line 52, delete "the"

Col. 2, line 57, after " "1" " insert --,-- (comma).

Col. 3, line 11, after "second" insert --NAND--.

Signed and Sealed this

Seventeenth Day of May, 1994

Attest:

BRUCE LEHMAN

Attesting Officer   Commissioner of Patents and Trademarks